(12) United States Patent
Kellerman et al.

(10) Patent No.: US 7,267,520 B2
(45) Date of Patent: Sep. 11, 2007

(54) WAFER SCANNING SYSTEM WITH RECIPROCATING ROTARY MOTION UTILIZING SPRINGS AND COUNTERWEIGHTS

(75) Inventors: Peter L. Kellerman, Essex, MA (US); Victor M. Benveniste, Gloucester, MA (US); Kourosh Saadatmand, Beverly, MA (US); Mehran Asdigha, Shrewsbury, MA (US); Douglas A. Brown, S. Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 365 days.

(21) Appl. No.: 11/099,022

(22) Filed: Apr. 5, 2005

(65) Prior Publication Data

US 2005/0254932 A1    Nov. 17, 2005

Related U.S. Application Data

(60) Provisional application No. 60/560,871, filed on Apr. 9, 2004.

(51) Int. Cl.
*B66F 9/00* (2006.01)

(52) U.S. Cl. ............ 414/680; 250/492.21; 250/442.11; 250/398; 294/119.1

(58) Field of Classification Search ............ None
See application file for complete search history.

(56) References Cited

U.S. PATENT DOCUMENTS 4,736,107 A    4/1988    Myron
5,486,080 A    1/1996    Sieradzki
5,737,500 A    4/1998    Seraji et al.
5,741,113 A    4/1998    Bacchi et al.
5,746,565 A    5/1998    Tepolt (Continued)

FOREIGN PATENT DOCUMENTS

EP    1 047 101 A2    10/2000

(Continued)

OTHER PUBLICATIONS

International Search Report, Int'l Application No. PCT/US2005/011497, Int'l Filing Date May 4, 2005, 2 pgs.

(Continued)

*Primary Examiner*—Jack I. Berman
*Assistant Examiner*—Zia R. Hashmi
(74) *Attorney, Agent, or Firm*—Eschweiler & Associates, LLC

(57) ABSTRACT

The present invention is directed to a scanning apparatus and method for processing a workpiece, wherein the scanning apparatus comprises a wafer arm and moving arm fixedly coupled to one another, wherein the wafer arm and moving arm are operable to rotate about a first axis. An end effector, whereon the workpiece resides, is coupled to the wafer arm. A rotational shaft couples the wafer arm and moving arm to a first actuator, wherein the first actuator provides a rotational force to the shaft. A momentum balance mechanism is coupled to the shaft and is operable to generally reverse the rotational direction of the shaft. The momentum balance mechanism comprises one or more fixed spring elements operable to provide a force to a moving spring element coupled to the moving arm. A controller is further operable to maintain a generally constant translational velocity of the end effector within a predetermined scanning range.

22 Claims, 7 Drawing Sheets

U.S. PATENT DOCUMENTS

| | | |
|---|---|---|
| 6,384,418 B1 | 5/2002 | Fujii et al. |
| 6,428,266 B1 | 8/2002 | Solomon et al. |
| 6,429,442 B1 | 8/2002 | Tomita et al. |
| 6,515,288 B1 | 2/2003 | Ryding et al. |
| 6,580,083 B2 | 6/2003 | Berrian |
| 6,777,687 B2 | 8/2004 | Vanderpot et al. |
| 6,953,942 B1 | 10/2005 | Graf et al. |
| 2001/0032937 A1 | 10/2001 | Berrian |
| 2003/0068215 A1 | 4/2003 | Mori et al. |
| 2003/0123958 A1 | 7/2003 | Sieradzki et al. |
| 2003/0192474 A1 | 10/2003 | Smick et al. |
| 2004/0058513 A1 | 3/2004 | Murrell et al. |
| 2004/0191931 A1 | 9/2004 | Murrell et al. |
| 2005/0184253 A1 | 8/2005 | Ioannou et al. |

FOREIGN PATENT DOCUMENTS

| | | |
|---|---|---|
| EP | 1 056 114 A2 | 11/2000 |
| JP | 11 007 915 | 1/1999 |
| WO | WO 00/05744 A1 | 2/2000 |
| WO | WO 2004/001789 A2 | 12/2003 |

OTHER PUBLICATIONS

International Search Report, Intl'l Application No. PCT/US2005/011581, Int'l Filing Date May 4, 2005, 2 pgs.

WAFER SCANNING SYSTEM WITH RECIPROCATING ROTARY MOTION UTILIZING SPRINGS AND COUNTERWEIGHTS

REFERENCE TO RELATED APPLICATION

This application claims priority to and the benefit of U.S. Provisional Application Ser. No. 60/560,871 which was filed Apr. 9, 2004, entitled WAFER SCANNING SYSTEM WITH RECIPROCATING ROTARY MOTION UTILIZING SPRINGS AND COUNTERWEIGHTS, the entirety of which is hereby incorporated by reference as if fully set forth herein.

FIELD OF THE INVENTION

The present invention relates generally to semiconductor processing systems, and more specifically to an apparatus and method for controlling a quality and precision of motion of a workpiece during semiconductor processing.

BACKGROUND OF THE INVENTION

In the semiconductor industry, various manufacturing processes are typically carried out on a workpiece (e.g., a semiconductor wafer) in order to achieve various results thereon. Processes such as ion implantation, for example, can be performed in order to obtain a particular characteristic on or within the workpiece, such as limiting a diffusivity of a dielectric layer on the workpiece by implanting a specific type of ion. Conventionally, ion implantation processes are performed in either a batch process, wherein multiple workpieces are processed concurrently, or in a serial process, wherein a single workpiece is individually processed. Traditional high-energy or high-current batch ion implanters, for example, are operable to achieve an ion beam line, wherein a large number of wafers may be placed on a wheel or disk, and the wheel is spun and radially translated through the ion beam, thus exposing all of the workpieces surface area to the beam at various times throughout the process. Processing batches of workpieces in such a manner, however, generally makes the ion implanter substantially large in size.

In a typical serial process, on the other hand, an ion beam is either scanned in a single axis across a stationary wafer, or the wafer is translated in one direction past a fan-shaped, or scanned ion beam. The process of scanning or shaping a uniform ion beam, however, generally requires a complex beam line, which is generally undesirable at low energies. Furthermore, a uniform translation and/or rotation of either the ion beam or the wafer is generally required in order to provide a uniform ion implantation across the wafer. However, such a uniform translation and/or rotation can be difficult to achieve, due, at least in part, to substantial inertial forces associated with moving the conventional devices and scan mechanism s during processing.

Therefore, a need exists for a device for scanning an ion beam across a workpiece, wherein the workpiece is uniformly translated and/or rotated with respect to the ion beam.

SUMMARY OF THE INVENTION

The present invention overcomes the limitations of the prior art. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a scanning apparatus for processing a workpiece. According to one exemplary aspect of the invention, a base portion is provided, wherein a first actuator is coupled thereto. A shaft is coupled to the first actuator, wherein the first actuator is operable to provide a rotational force to the shaft about a first axis. A wafer arm, or pendulum, associated with the workpiece is generally fixedly coupled to the shaft, wherein the rotation of the shaft corresponds to a rotation, or swinging, of the wafer arm in a pendulum type or other type motion. The workpiece, for example, generally resides on an end effector operably coupled to the wafer arm, wherein the end effector is generally eccentric to the first axis. The end effector, for example, is coupled to the wafer arm at a predetermined first distance from the first axis. The rotation of the shaft, therefore, is operable to generally translate (and oscillate) the workpiece residing on the end effector along a first scan path.

In accordance with another exemplary aspect of the invention, a generally constant velocity of the end effector can be maintained in a predetermined range of motion along the first scan path, wherein a translational velocity of the end effector with respect to the base portion is controlled, wherein acceleration and deceleration of the end effector occurs outside of the predetermined range of motion of the end effector.

According to another exemplary aspect of the invention, a momentum balance mechanism is provided, wherein the momentum balance mechanism generally provides a reversal of direction of rotation of the wafer arm, and thus, a reversal of direction of the workpiece along the first scan path. The momentum balance mechanism generally is balanced about the first axis, wherein a torque in relation to the first axis is generally minimized. The momentum balance mechanism, according to another example, comprises one or more generally fixed spring elements which are generally fixed with respect to the momentum balance mechanism, but may be moveable with respect to the base portion. For example, the one or more fixed spring elements are generally coupled to distal ends of a pair of momentum balance arms, wherein the one or more fixed spring elements associated with an individual momentum balance arm generally maintain a generally fixed distance from one another, yet the one or more fixed spring elements may be operable to rotate about the respective distal end of the individual momentum balance arm. Furthermore, the pair of momentum balance arms may be rotatable about the first axis, wherein each momentum balance arm is further rotatable with respect to the other momentum balance arm. Therefore, a distance separating the fixed spring elements associated with one of the pair of momentum balance arms from the fixed spring elements associated with the other momentum balance arm is further variable. Such variable distance between the fixed spring elements is further controllable, for example, by a controller.

According to another aspect, a moving arm is further fixedly coupled to the shaft, wherein the moving arm is operable to rotate about the first axis with the rotation of the wafer arm. The moving arm, for example, comprises one or more moving spring elements, wherein a force between the one more moving spring elements and the one or more fixed spring elements associated with the momentum balance mechanism is operable to generally reverse a direction of rotation of the shaft, and thus generally provide a reversal of translational direction of the workpiece along the first scan path. The one or more fixed spring elements and the one or more moving spring elements may comprise one or more of magnets, electromagnets, mechanical springs, pneumatic springs, or other springs or actuation mechanisms.

The momentum balance mechanism, wafer arm, and moving arm, according to another example, are generally balanced about the first axis, wherein torque associated with the first axis is generally minimized. One or more counterweights may be associated with the respective momentum balance mechanism, wafer arm, and moving arm, wherein the one or more counterweights generally balance the respective components about the first axis. Furthermore, according to another exemplary aspect of the invention, the momentum balance mechanism has an inertial mass which is significantly greater than that of the moving arm and wafer arm, wherein a force on the momentum balance mechanism caused by the oscillation of the wafer arm is generally absorbed by the momentum balance mechanism. Still further, a control of the rotation of the wafer arm about the first axis by controlling the rotational force provided by the first actuator is operable to generally stabilize a rotation of the pair of momentum balance arms about the first axis. For example, a slightly higher rotational force applied to the shaft in a first rotational direction and a slightly lower rotation force applied to the shaft in a second rotation direction by the first actuator is operable to rotate the momentum balance mechanism in the first direction about the first axis, and vice versa.

According to yet another exemplary aspect, a secondary translation mechanism is further provided, wherein the base portion and associated wafer arm are further operable to translate along a second scan path, generally referred to as a slow scan axis, wherein the second scan path, for example, is generally perpendicular to at least a portion of the first scan path.

According to another exemplary aspect of the invention, a scanning system is provided, wherein a controller is operable to control the rotational velocity of the end effector such that the movement of the workpiece within the predetermined range is maintained at a substantially constant value. Also, a method for scanning a workpiece is provided, wherein the method comprises rotating the wafer arm in a predetermined manner by oscillating the moving arm between the pair of momentum balance arms, wherein the workpiece is translated with respect to the base portion within the predetermined range along the first scan path at a generally constant velocity.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
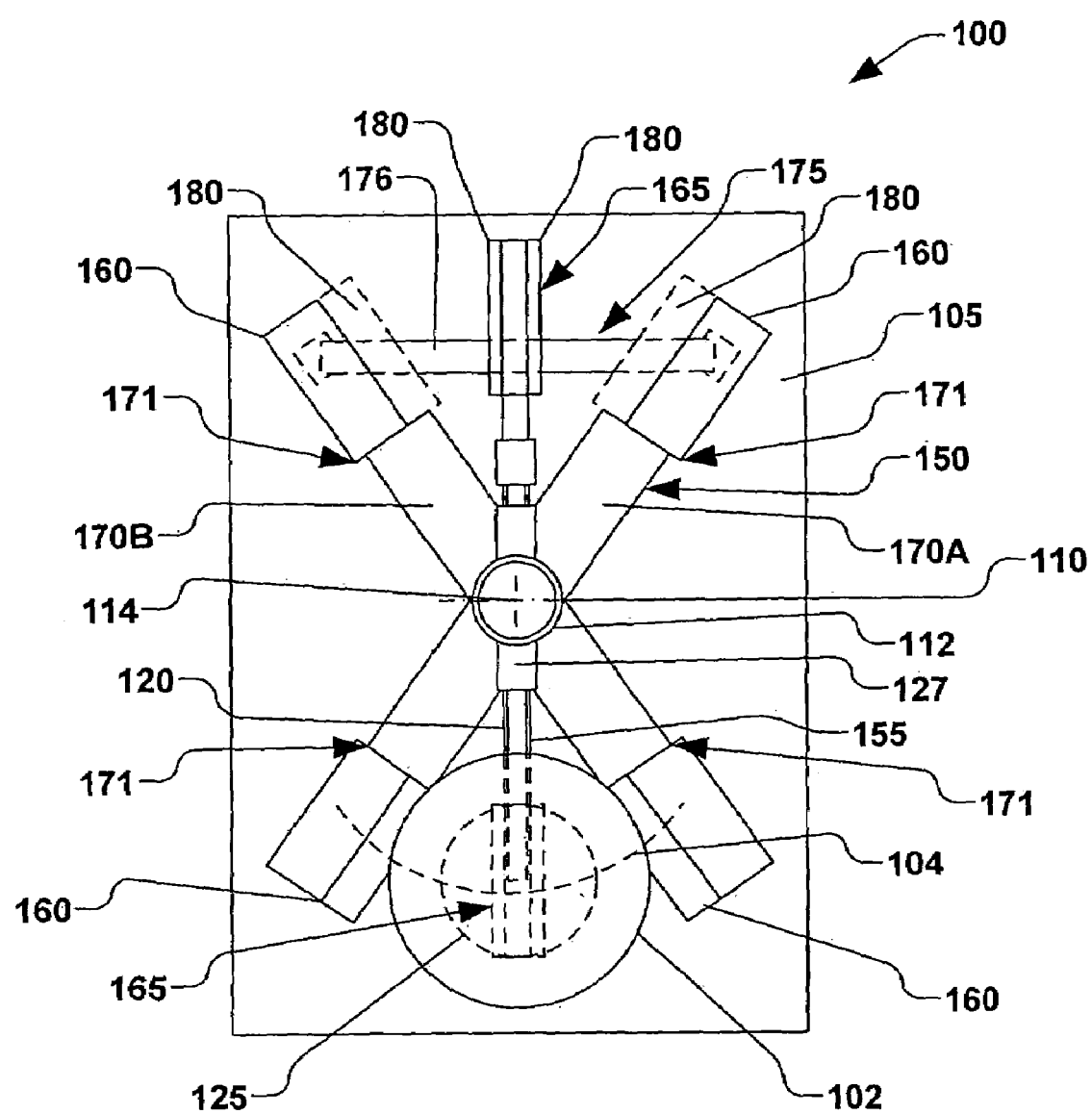
FIG. 1 is a plan view of an exemplary scanning apparatus according to one aspect of the present invention.

The present invention is directed generally towards a scanning apparatus for moving a workpiece relative to a beam. More particularly, the scanning apparatus is operable to translate the workpiece at a generally constant velocity with respect to a spot beam within a predetermined scan range, wherein a motion of the scanning apparatus oscillates via a momentum balance mechanism. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention is directed toward a two-dimensional scanning apparatus, wherein a workpiece is reciprocated in an oscillatory manner. One or more spring elements are provided for rapid acceleration and deceleration of the workpiece at ends of the oscillation path in order to achieve a generally uniform translation of the workpiece within a predetermined range. The following description details several exemplary aspects of the invention, however, these examples are not intended to be limiting, and various alternatives to the examples are contemplated as falling within the scope of the invention.

Figure 2:
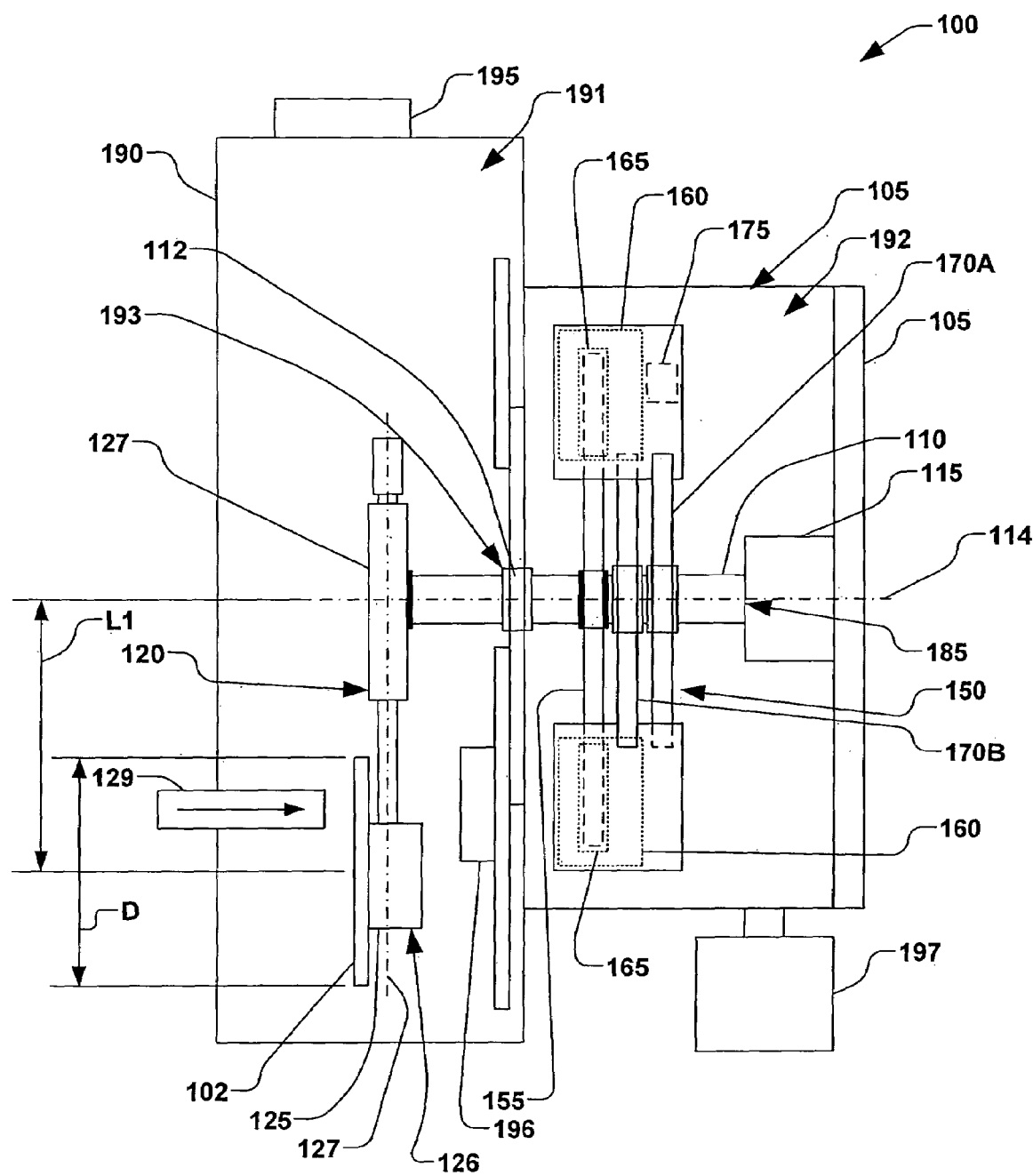
FIG. 2 is a side view of the exemplary scanning apparatus of FIG. 1 according to another aspect of the invention.

Referring now to the figures, in accordance with one exemplary aspect of the present invention, FIGS. 1 and 2 illustrate a respective a plan view and side view of an exemplary scanning apparatus 100 which is operable to oscillate a workpiece 102 along a predetermined first scan path 104. It should be further noted that the scanning apparatus 100 is not drawn to scale, and that the various components may or may not be illustrated for clarity purposes. Therefore, it shall be understood that the various features illustrated can be of various shapes and sizes, or excluded altogether, and all such shapes, sizes, and exclusions are contemplated as falling within the scope of the present invention.

According to one example, the scanning apparatus 100 is operable to oscillate the workpiece 102 with respect to an ion beam (not shown) used in an ion implantation process, as will be discussed hereafter. It should be noted that the present invention may be utilized in conjunction with various semiconductor processing systems, and all such systems are contemplated as falling within the scope of the present invention. The scanning apparatus 100, for example, comprises a base portion 105, wherein the base portion is stationary with respect to the beam (not shown), or may be further operable to move with respect to the beam, as will be discussed hereafter. It should be noted that the base portion 105 can be of any shape, and that the rectangular shape utilized in the figures is merely a simplistic illustrative example.

In accordance with one aspect of the invention, the scanning apparatus 100 comprises a shaft 110 associated therewith, wherein, for example, the shaft is rotatably coupled to the base portion 105 via a sliding bearing 112. The shaft 110, for example, is further operable to rotate about a first axis 114. The shaft 110, for example, is further operably coupled to a first actuator 115, as illustrated in FIG. 2, wherein the first actuator is generally fixedly coupled to the base portion 105. The first actuator 115, for example, comprises a rotary actuator such as a servo motor, wherein the first actuator is operable to vary a rotational velocity of the shaft 110 about the first axis 114. According to one example, the first actuator 115 is operable to rotate the shaft 110 in both a clockwise and counterclockwise direction about the first axis 114.

The scanning apparatus 100 further comprises a wafer arm 120 coupled to the shaft 110, wherein the wafer arm further comprises an end effector 125 which is operably coupled thereto, whereon the workpiece 102 generally resides. According to one example, the end effector 125 is spaced a predetermined first distance L1 from the first axis 114. According to another example, the first distance L1 is variable, wherein the wafer arm 120 further comprises wafer handling mechanism 127 operable to translate the end effector 125 in a direction generally perpendicular to the first axis 114. According to another example, the wafer arm 120 comprises an elongate member which is generally fixedly coupled to the shaft 110, wherein the rotation of the shaft about the first axis 114 generally rotates the end effector 125 about the first axis, thus translating the end effector (and hence, the workpiece 102) along the first scan path 104 with respect to the base portion 105.

The end effector 125, for example, is operable to secure the workpiece 102 thereto, wherein a movement of the end effector generally defines a movement of the workpiece. In one example, the end effector 125 comprises an electrostatic chuck (ESC), wherein the ESC is operable to substantially clamp or maintain a position of the workpiece with respect to the end effector. Alternatively, the end effector 125 may comprise various other devices for maintaining a grip of a payload (e.g., the workpiece), and all such devices are contemplated as falling within the scope of the present invention.

The end effector 125, according to another example, is operably coupled to the wafer arm 120 via a first joint 126 associated with the wafer arm, wherein the first joint is spaced the predetermined first distance L1 from the first axis 114. The first joint 126, for example, is operable to provide a rotation of the end effector 125 about a second axis 127. Furthermore, according to another example, the first joint 126 is further operable to provide a tilt (not shown) of the end effector 125, wherein, in one example, the end effector is operable to tilt about one or more axes (not shown). The first joint 126, for example, comprises a prismatic joint.

In accordance with another exemplary aspect of the invention, the rotation of the shaft 110 and wafer arm 120 can be further controlled in order to oscillate the end effector 125 along the first scan path 104 of FIG. 1, wherein the workpiece 102 can be moved in a predetermined manner with respect to an ion beam (e.g., an ion beam 129 of FIG. 2 which is generally stationary with respect to the base portion 105 and incident with a portion of the first scan path 104). A rotation of the first joint 126, for example, can be further controlled, wherein the end effector 125 is maintained in a generally constant rotational relation with the first scan path 104.

In order to evenly process the workpiece 102, it is important to maintain a generally constant translational velocity of the end effector 125 when the workpiece 102 is subject to the ion beam 129 while traveling along the first scan path 104. Maintaining a generally constant velocity of the end effector 125 provides a generally uniform scan of the ion beam 129 across the workpiece 102 residing on the end effector 125, thus evenly processing the workpiece as it travels along the arcuate first scan path 104. According to one example, during the oscillation of the end effector 125, a substantially constant velocity of the end effector is generally desirable within a predetermined range of motion thereof.

Figure 3:
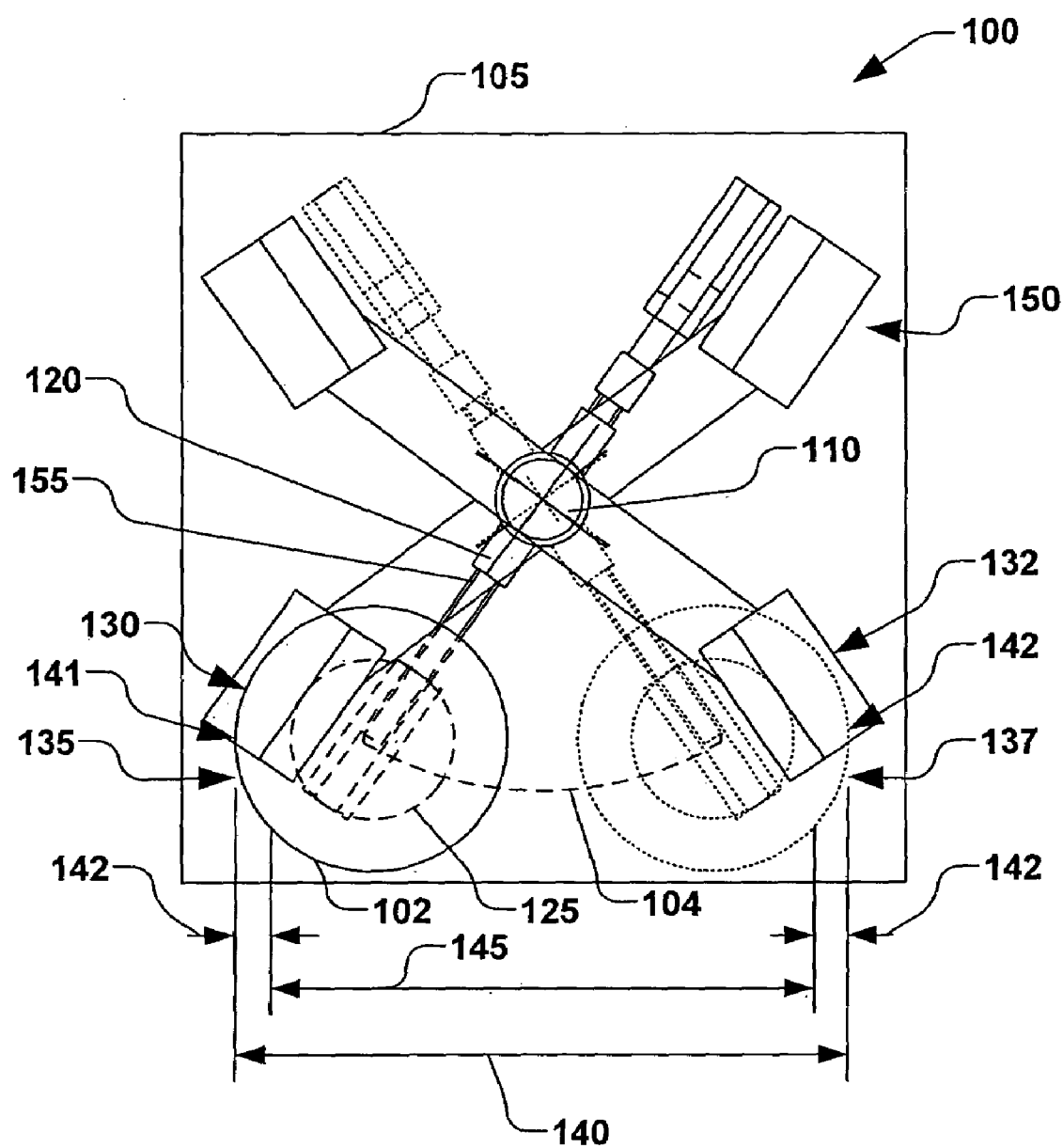
FIG. 3 is a plan view of another scanning apparatus according to another exemplary aspect of the invention.

As illustrated in FIG. 3, the scanning apparatus 100 is operable to oscillate the workpiece 102 along the first scan path 104 between maximum positions 130 and 132 of the end effector 125 in a pendulum type motion. The maximum positions 130 and 132 of the end effector 125 further correspond to maximum positions 135 and 137 of the rotation of the wafer arm 120, relative to the base portion 105. Therefore, a maximum scan distance 140 traveled by opposite ends 141 of the workpiece 102 can be generally defined along the curvilinear first scan path 104 (e.g., opposite ends of the circumference of the workpiece along the first scan path), wherein the maximum scan distance is associated with the maximum positions 130 and 132 of the end effector 125 and the maximum positions 135 and 137 of the wafer arm 120. According to one exemplary aspect of the invention, the maximum scan distance 140 is greater than twice a diameter D of the workpiece 102. The amount by which the maximum scan distance 140 is greater than twice the diameter D is defined as an overshoot 142. The overshoot 142, for example, can be advantageously utilized when the oscillation of the workpiece 102 along the first scan path 104 changes directions, such as between a clockwise and counter-clockwise rotation of the shaft 110.

Therefore, the workpiece 102 oscillates along the first scan path 104, thus changing direction at the maximum positions 130 and 132 (as further associated with maximum positions 135 and 137). Such a change in direction of the end effector 125 is further associated with a change in velocity and acceleration of the end effector and workpiece 102. In ion implantation processes, for example, it is generally desirable for the end effector 125 to maintain a substantially constant velocity along a portion of the scan path 104 when the workpiece 102 passes through an ion beam (e.g., as illustrated in FIG. 2), such as an ion beam which is generally incident with the workpiece. Such a constant velocity provides for the workpiece 102 to be generally evenly exposed to the ion beam throughout the movement through the ion beam. However, due to the oscillatory motion of the end effector 125, acceleration and deceleration of the end effector is inevitable; such as when the wafer arm 120 (e.g., associated with the end effector and workpiece 102) approaches the maximum positions 130 and 132 at either extent of the curvilinear oscillation, as illustrated again in FIG. 3. Such an acceleration and deceleration near the maximum positions 130 and 132 and associated maximum positions 135 and 137 of the wafer arm 120 (e.g., during scan path turn-around), should be maintained at reasonable levels in order to minimize inertial forces and associated reaction forces transmitted to the base portion 105 of the scanning apparatus 100. Furthermore, variations in velocity of the end effector 125 during exposure of the workpiece 102 to the ion beam, for example, can lead to a non-uniform ion implantation across the workpiece.

Therefore, a generally constant velocity is desired for a predetermined range 145 associated with the movement of the workpiece 102 through the ion beam. For example, the predetermined range 145 is associated with the physical dimensions of the workpiece 102 (e.g., approximately twice a diameter of the workpiece or greater), such that the acceleration and deceleration of the end effector 125 can be generally accommodated within the overshoot 142. Accordingly, once the workpiece 102 completely passes through the ion beam, the acceleration and deceleration of the end effector 125 will not substantially affect an ion implantation process or dose uniformity across the workpiece. Such a constant velocity, for example, can be obtained by controlling an amount of power applied to the first actuator 115, as will be discussed in more detail infra.

Rapid acceleration and deceleration of the wafer arm 120 within the overshoot region 142 is attained, in one example, by the use of a momentum balance mechanism 150. The momentum balance mechanism 150, for example, is operable to generally provide a rapid acceleration and deceleration of the end effector 125 associated with the wafer arm 120 in an efficient manner. Referring again to FIGS. 1 and 2, for example, the momentum balance mechanism 150 comprises one or more fixed spring elements 160 which are generally fixed relative to the momentum balance mechanism. The scanning apparatus 100, for example, further comprises a moving arm 155 such as an elongate member, which is generally coupled to the shaft 110, wherein the moving arm is generally fixed relative to the wafer arm 120. The one or more fixed spring elements 160 associated with the momentum balance mechanism 150, for example, are operable to accelerate and decelerate the moving arm 155, and thus, the wafer arm 120, in the overshoot region 142 of FIG. 3 by generally providing a repelling force between the one or more fixed spring elements and the moving arm and/or the wafer arm. The one or more fixed spring elements 160, for example, may comprise one or more of magnets, electromagnets, mechanical springs, and/or pneumatic springs. According to one example, the wafer arm 120 and the moving arm 155 are integrated together as single member. Alternatively, the wafer arm 120 and moving arm 155 are individual members fixedly coupled to the shaft 110, as illustrated in FIG. 2. According to another example, one or more stiffening elements (not shown) are associated with one or more of the wafer arm 120 and the moving arm 155, wherein the one or more stiffening elements generally provide an amount of rigidity to the respective wafer arm and moving arm. Furthermore, one or more counterweights (not shown) are associated with one or more of the wafer arm 120, the moving arm 155 and the momentum balance arms 170A and 170B, wherein the one or more counterweights generally minimize an amount of torque associated with the rotation of the respective wafer arm, moving arm, and momentum balance arms about the first axis.

According to another example, the moving arm 155 further comprises a moving spring element 165 operably coupled thereto. The moving spring element 165, for example, may comprise one or more of magnets, electromagnets, mechanical springs, and/or pneumatic springs, wherein the moving spring element generally rotates about the first axis 114 with the moving arm 155. The moving spring element 165, for example, is further operable to provide a force between itself and the one or more fixed spring elements 160, wherein the moving spring element, and hence, the moving arm, is generally repelled away from the one or more fixed spring elements. Such a repulsion of the moving spring element 165, for example, can advantageously provide a fast acceleration and deceleration of the moving arm 155, and thus, the wafer arm 120 and workpiece 102, as will be discussed infra.

According to another exemplary aspect of the present invention, the momentum balance mechanism 150 comprises a pair of momentum balance arms 170 which are rotatably coupled to the shaft 110, and wherein the one or more fixed spring elements 160 are further coupled to the pair of momentum balance arms. For example, the one or more fixed spring elements 160 are fixedly coupled to the respective momentum balance arm at one or more distal ends 171 thereof. According to another example, the one or more fixed spring elements 160 are operable to rotate with respect to the associated momentum balance arm, while still residing at the distal end 171 of the respective balance arm, thus still maintaining a fixed position relative to the first axis 114. Each of the pair of momentum balance arms 170, for example, is further rotatably coupled to the shaft 110 (e.g., by one or more bearings) at a respective center of gravity thereof, wherein each momentum balance arm is rotationally balanced about the shaft.

The pair of momentum balance arms 170A and 170B, as illustrated in FIG. 1, for example, are individually rotatably coupled to the shaft, wherein an angular orientation between the momentum balance arms is variable. Such a variability in angular orientation, for example, generally provides a variation in the maximum scan distance 140 of FIG. 3, and can be utilized to generally optimize the first scan path 104 with regards to an amount of surface area to be scanned on the workpiece 102.

According to one exemplary aspect, the scanning apparatus 100 further comprises an amplitude control mechanism 175, as illustrated in FIG. 1, wherein the amplitude control mechanism is operably coupled to the pair of momentum balance arms 170A and 170B. The amplitude control mechanism 175, for example, generally determines the angular orientation between the pair of momentum balance arms 170A and 170B, therein defining a variable distance (e.g., a variable maximum scan distance 140 of FIG. 3) between the one or more fixed spring elements associated with the respective momentum balance arms. Such a variable distance, as discussed above, generally provides a variable amplitude of oscillation of the moving spring element 160, and thus a variable amplitude of oscillation of the workpiece 102. The amplitude control mechanism 175, for example, comprises a worm gear 176 or other mechanism operably coupled to the pair of momentum balance arms 170A and 170B. Furthermore, the amplitude of oscillation is further adjustable with respect to time or other factors via a control of the amplitude control mechanism 175. Alternatively, the amplitude control mechanism 175 generally fixedly couples the pair of momentum balance arms 170A and 170B, therein generally fixing the amplitude of oscillation with respect to time or other factors.

Figure 4:
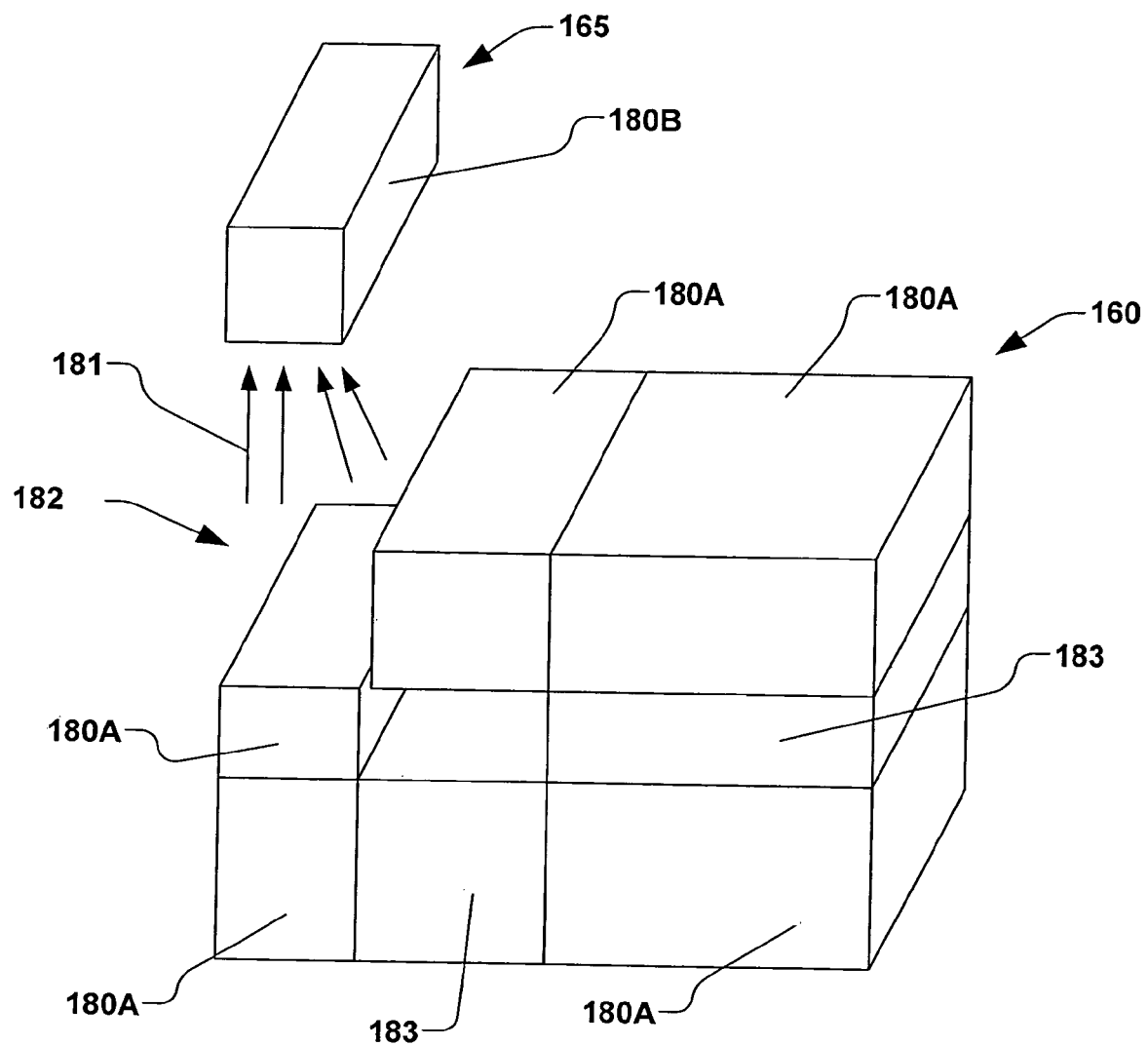
FIG. 4 is a perspective view of an exemplary fixed spring element and moving spring element according to another exemplary aspect of the invention.
Figure 5:
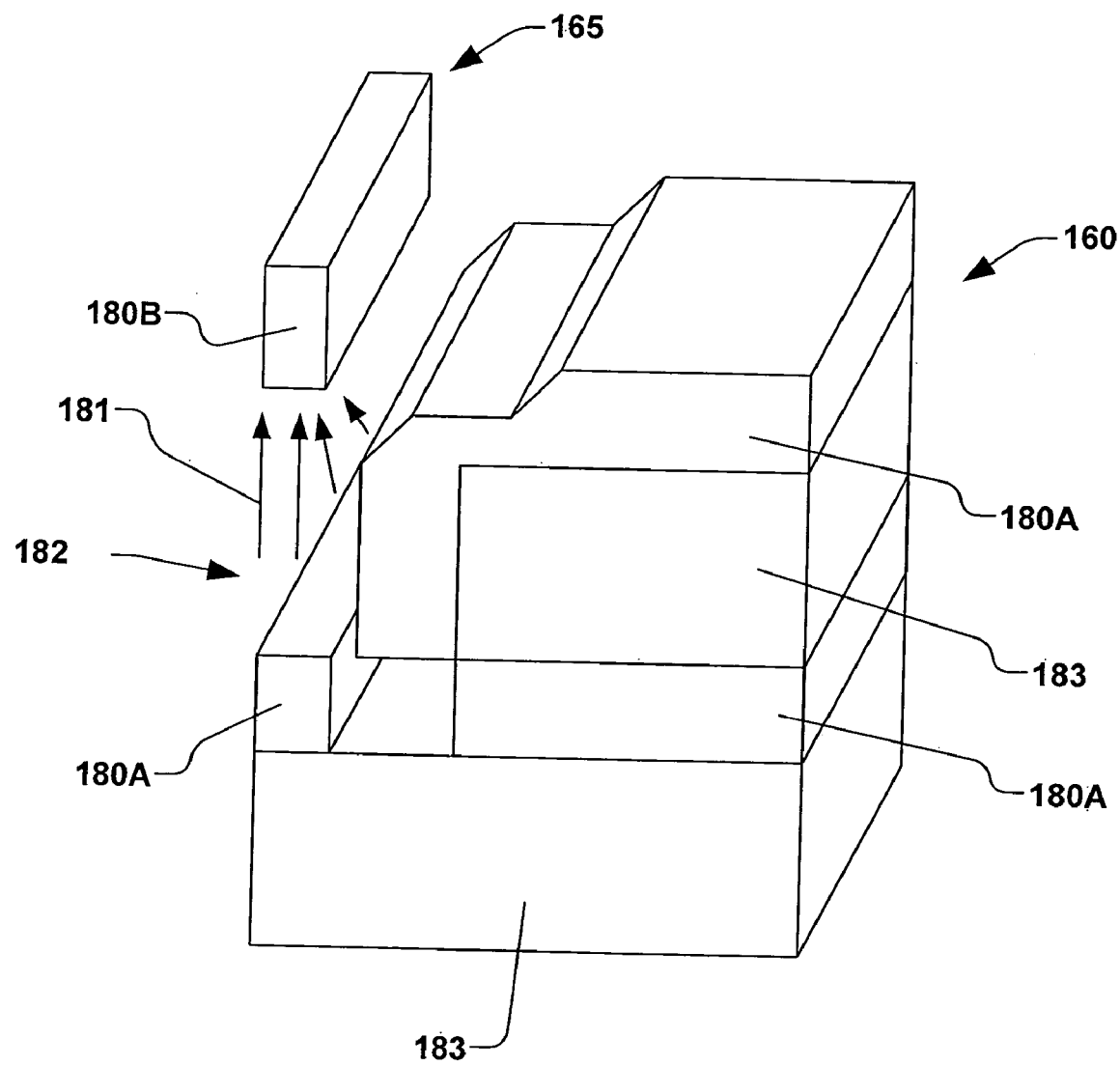
FIG. 5 is a perspective view of another exemplary fixed spring element and moving spring element according to yet another exemplary aspect of the invention.

According to a preferred embodiment of the present invention, the one or more fixed spring elements 160 comprise one or more magnets 180A and the moving spring element 165 comprises one or more magnets 180B. For example, the one or more magnets 180A and 180B comprise rare earth magnets further comprising one or more of iron, boron, and neodymium. Other magnets 180 may also be used, and any magnet which provides a strong magnetic field is contemplated as falling within the scope of the present invention. Alternatively, the one or more magnets 180 may comprise one or more electromagnets. FIGS. 4 and 5 illustrate exemplary fixed spring elements 160 comprising one or more magnets 180. For example, in FIG. 4, the one or more magnets 180 are oriented in a manner such that the magnetic field is optimized to provide a repelling force 181 in an interface area 182, wherein the interface area comprises a region when the moving spring element 165 is proximate to the fixed spring element 160. Furthermore, one or more yokes 183 (e.g., steel elements) further tune the magnetic field to provide a substantial repelling force 181.

In accordance with yet another exemplary aspect of the present invention, the first actuator 115 of FIG. 2, for example, is operable to vary a rotational velocity of the shaft 110 (and hence, the workpiece 102) in accordance with a rotational position of one or more of the shaft, wafer arm 120, end effector 125, moving arm 155, and momentum balance mechanism 150. For example, the scanning apparatus 100 comprises one or more sensing elements 185 which are operable to sense a position of the workpiece 102 along the first scan path 104 by sensing the rotational position of one or more of the shaft 110, wafer arm 120, end effector 125, moving arm 155, and momentum balance mechanism 150. The sensed position of the workpiece 102 can be utilized for feedback control as will be described infra. For example, the one or more sensing elements 185 may comprise one or more of rotary encoders or linear encoders coupled to the shaft 110, wafer arm 120, end effector 125, moving arm 155, and/or momentum balance arms 170.

In accordance with another exemplary aspect of the invention, as illustrated in FIG. 2, the scanning apparatus 100 comprises a process chamber 190, wherein the wafer arm 120 generally resides within the process chamber. The scanning apparatus 100, for example, is partitioned between a process chamber environment 191 within the process chamber 190 and an external environment 192, such that a minimum of moving components reside within the process chamber environment. For example, the shaft 110 is generally sealed between the process chamber 190 and the external environment 192 by a dynamically sealed joint 193 (e.g., the sliding bearing 112), wherein the sealed joint substantially seals the process chamber environment 191 (e.g., a vacuum chamber environment under low pressure vacuum) from the external environment 192 (e.g., atmosphere). The dynamically sealed joint 193, for example, may comprise the sliding bearing 112 as discussed above, or may comprise any other sealing joint which generally separates the process chamber environment from the external environment. Such a sealed joint 193, for example, generally isolates the wafer arm 120 and end effector 125, and permits the translation of the end effector 125 within the process chamber environment 191, while limiting potential deleterious effects caused by moving components associated with the momentum balance mechanism 150 and first actuator 115. Alternatively, any or all of the scanning apparatus 100 may reside within the process chamber 190. Furthermore, the scanning apparatus further comprises a wafer handling port 195 associated with the process chamber 190, wherein wafer arm 120 is operable to rotate and/or translate the end effector 125 to the wafer handling port in order to insert or remove workpieces 102. Furthermore, a faraday cage 196 is provided, wherein the faraday cage is operable to generally measure an amount of ions being emitted from the ion source 129 for greater process control.

Referring again to FIG. 2 another exemplary aspect of the present invention is illustrated, wherein the base portion 105 of the exemplary scanning apparatus 100 is further operable to translate in one or more directions. For example, the base portion 105 is operably coupled to a secondary translation mechanism 197, wherein the secondary translation mechanism is operable to translate the base portion along a second scan path (not shown). In one example, the second scan path is substantially perpendicular to at least a portion of the first scan path 104 of FIG. 1. For example, the second scan path is substantially perpendicular to midpoint of the first scan path 104. According to another exemplary aspect of the invention, the first scan path 104 is associated with a fast scan of the workpiece 102, and the second scan path (not shown) is associated a slow scan of the workpiece, wherein the workpiece is indexed one increment along the second scan path for every translation of the workpiece between maximum positions 130 and 132 along the first scan path (e.g., as illustrated in FIG. 3). Therefore, for a full oscillation of the workpiece 102 along the first scan path 104 the secondary translation mechanism 197 will translate the workpiece two increments along the second scan path. A total translation of the base portion 105 along the second scan path, for example, is approximately the diameter D of the workpiece 102.

The secondary translation mechanism 197, for example, may further comprise a ball screw system (not shown), wherein the base portion 105 can be smoothly translated along the second scan path. Such a secondary translation mechanism 197, for example, is operable to "paint" the workpiece 102 residing on the end effector 125 by passing the workpiece through the ion beam in an incremental manner during the oscillation of the end effector, thus uniformly implanting ions across the entire workpiece.

Figure 6:
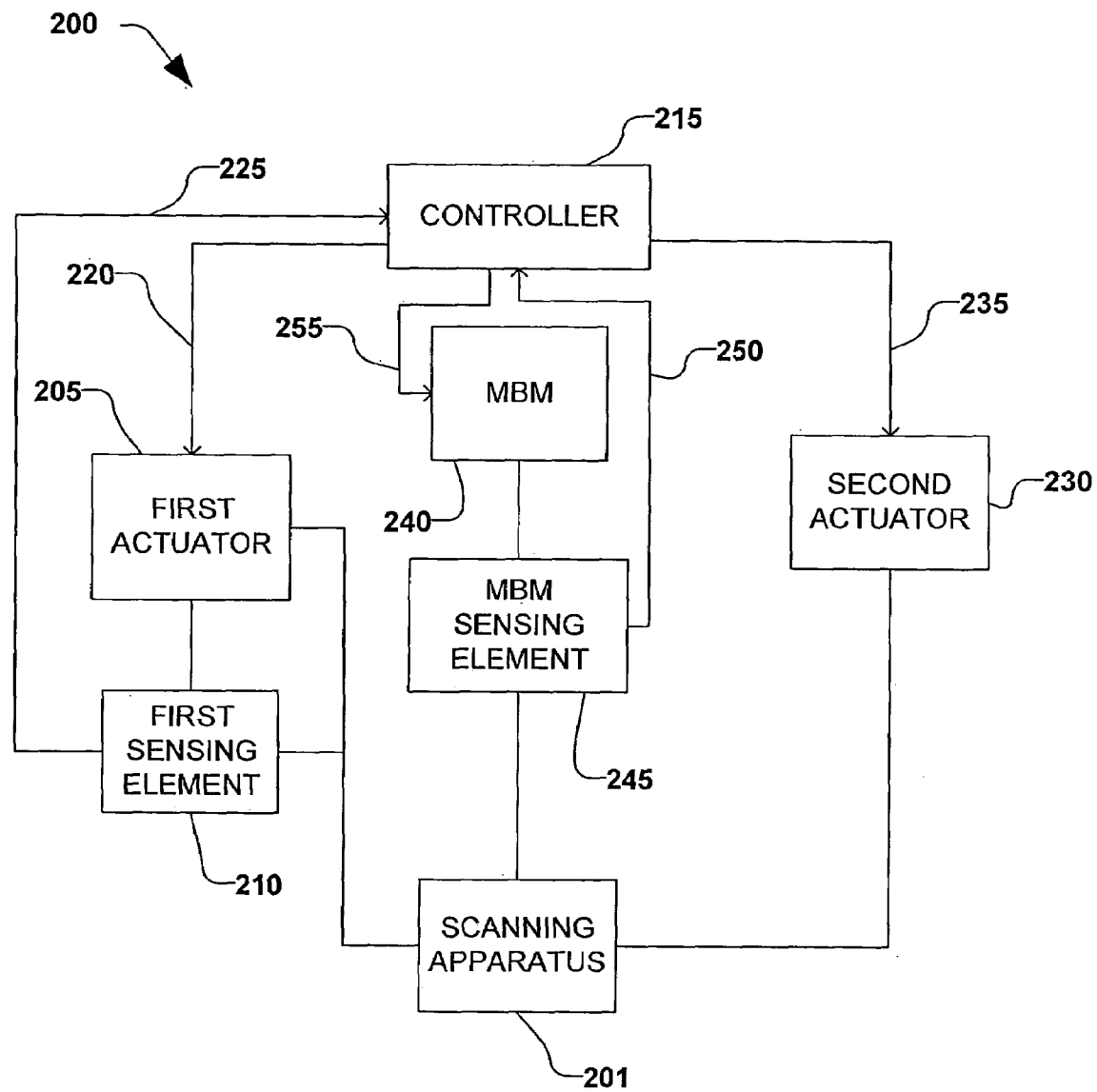
FIG. 6 is a system-level block diagram of an exemplary scanning system according to still another aspect of the present invention.

FIG. 6 illustrates another exemplary aspect of the present invention in block diagram form, wherein a scanning system 200 is disclosed. The scanning system 200, for example, comprises a scanning apparatus 201, such as the scanning apparatus 100 of FIG. 1. It should be understood that the scanning system 200 may comprise various alternative scanning apparatus 201, such as those described above, and incorporation of all such scanning apparatus are contemplated as falling within the scope of the present invention.

Referring again to the exemplary scanning system of FIG. 6, a first actuator 205 is associated with the wafer arm (e.g., via the shaft), wherein the first actuator is operable to provide a rotational force to the shaft and wafer arm as described above. The scanning system 200 further comprises a first sensing element 210 associated with the first actuators 205, wherein the first sensing element is further operable to sense a position, or other kinematic parameter, such as velocity or acceleration, of the shaft, wafer arm, and/or end effector.

Furthermore, according to another exemplary aspect of the invention, a controller 215 (e.g., a motion controller) is operably coupled to drivers and/or amplifiers (not shown) of the first actuator 205 and the first sensing element 210, wherein the controller 215 is operable to control an amount of power 220 (e.g., a drive signal) provided to the first actuator for an associated control duty cycle (e.g., a movement of the end effector 125 between maximum positions 130 and 132 illustrated in FIG. 3). The first sensing element 210 of FIG. 6, such as an encoder or resolver, is further operable to provide one or more feedback signals 225 to the controller 215, wherein the drive signal 220 to the first actuator 205, for example, is calculated in real-time. Such real-time calculations of the drive signal 220 generally permit a precise adjustment of the power delivered to the first actuator 205 at predetermined time increments.

In accordance with another exemplary aspect of the invention, the general scheme of motion control disclosed in the invention generally provides a smoothness of motion of the end effector (e.g., a constant velocity within the predetermined range), and can minimize velocity errors associated therewith. According to another example, the controller 215 comprises a proportional integral derivative (PID) control device that can be utilized by the controller, wherein the first sensing element 210 generally provides feedback control.

As discussed in the above example, the amount of power 220 provided to the first actuator 205 is based, at least in part, on the position sensed by the first sensing element 210. Accordingly, the position of the end effector 125 of the scanning apparatus can be controlled by controlling the amount of power provided to the first actuator 205, wherein the amount of power is further associated with a velocity and acceleration of the end effector along the first scan path 104 of FIG. 1. The controller 215 of FIG. 6, for example, is further operable to control a second actuator 230 (e.g., such as the secondary translation mechanism 197 of FIG. 2), by providing an amount of power 235 to the second actuator 230, therein further controlling the motion of the end effector 125 along the second scan path. According to one example, an incremental motion (e.g., a "slow scan" motion) of the secondary translation mechanism 197 of FIG. 2 is synchronized with the motion of the end effector 125 along the first scan path 104 of FIG. 1 (e.g., a "fast scan" motion), such that the secondary translation mechanism is incrementally moved after each pass of the workpiece 102 through the ion beam (e.g., during a change of direction of the wafer along the fast scan path).

According to another exemplary aspect of the invention, an orientation of the momentum balance mechanism 240 is operable to be controlled by the controller 215. One or more sensing elements 245 associated with the momentum balance mechanism 240, for example, are operable to determine one or more of an angular orientation of the momentum balance arms 170A and 170B of FIG. 1 and/or a rotation of the momentum balance mechanism with respect to the base portion 105. The sensing elements 245, for example, provide feedback 250 to the controller 215, wherein the controller is operable to determine an adjustment to the rotation of the momentum balance arms 170A and 170B with respect to one another and/or the rotation of the momentum balance arms with respect to the base portion. If an adjustment to the rotation of the momentum balance arms 170A and 170B with respect to one another is needed (e.g., an increase or decrease in the maximum scan range 140 of FIG. 3), the controller 215 is operable to provide a signal 255 to the momentum balance mechanism to change the angular orientation of the momentum balance arms with respect to one another (e.g., by controlling the amplitude control mechanism 175 of FIG. 1). If an adjustment to the rotation of the momentum balance arms 170A and 170B with respect to the base portion 105 is needed, the controller 215, for example, is operable to adjust the amount of power 220 provided to the first actuator 205, therein providing an additional rotational force to the wafer arm in one or more rotational directions. Such a control of the first actuator 205, for example, can adjust for "drift" in the momentum balance mechanism 240, wherein the momentum balance mechanism is generally maintained in a generally stationary orientation with respect to the base portion.

While the structure and system disclosed in FIGS. 1-6 relate to a pendulum type motion system, the present invention also contemplates a linear motion system, wherein a workpiece translates linearly along a first (e.g., fast) scan path with a second generally orthogonal (e.g., slow) scan path. In such a case, the linear motion along the first scan path is reciprocated using spring elements such as mechanical, magnetic, or other type spring mechanism, and such a variation is contemplated as falling within the scope of the present invention.

Figure 7:
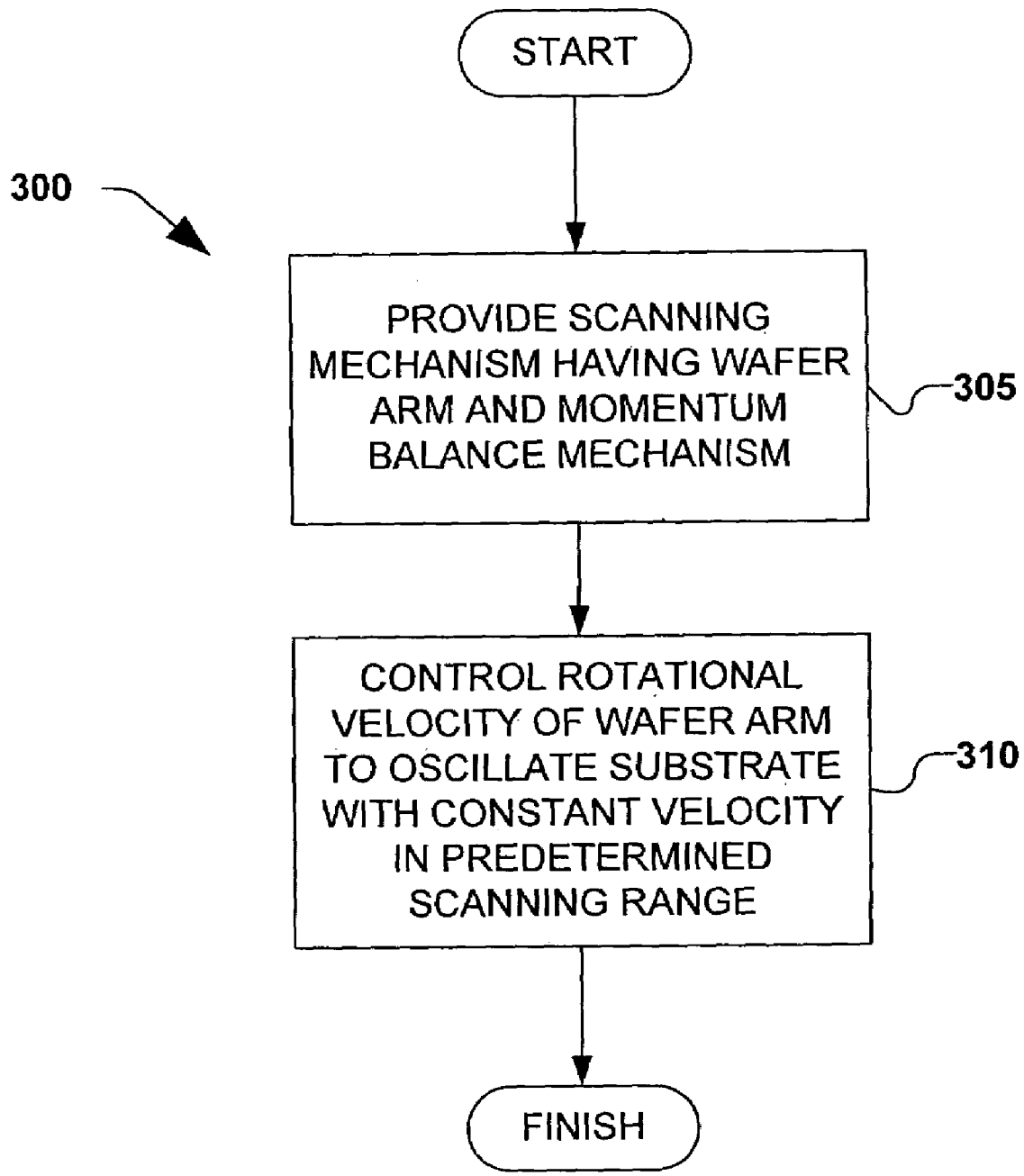
FIG. 7 is a block diagram of a method for processing a workpiece according to another exemplary aspect of the invention.

According to still another exemplary aspect of the present invention, FIG. 7 is a schematic block diagram of an exemplary method 300 illustrating the integration and operation of the exemplary scanning apparatus of FIG. 1. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 7, the method 300 begins with providing a scanning apparatus comprising a wafer arm and momentum balance mechanism in act 305. For example, a scanning apparatus such as the scanning apparatus 100 of FIG. 1 may be provided, wherein the scanning apparatus comprises a base portion, a first actuator, a shaft operably coupled to the first actuator, a momentum balance mechanism generally rotatably coupled to the shaft, a wafer arm generally fixedly coupled to the shaft, and a moving arm generally fixedly coupled to the shaft. A workpiece is further provided on the an end effector associated with the wafer arm. Upon application of a first power to the first actuator, for example, the first actuator is operable to rotate the shaft, thus providing an oscillation force to the wafer arm and oscillating the end effector associated with the wafer arm along a first scan path. The oscillation is controlled in act 310, wherein the end effector oscillates between two maximum positions, and wherein the velocity of the end effect or is maintained generally constant within a predetermined range. Within the predetermined range, for example, an ion beam impinges upon the workpiece, wherein the workpiece is substantially uniformly exposed to the ion beam throughout the motion of the workpiece.

The control of the oscillation in act 310, for example, can be further achieved by controlling the amount of power applied to the first actuator and further controlling an orientation of the momentum balance mechanism.

The scanning apparatus of the present invention further provides sufficient dexterity such that the scanning apparatus can further participate in material handling tasks. Such material handling tasks, for example, may comprise placing or transferring processed wafers to another transfer mechanism. Conversely, loading or picking of un-processed wafers can further be accomplished by mating with another transfer device.

In accordance with another exemplary aspect of the present invention, the scanning apparatus can be further utilized in a process chamber (not shown) that is in a state of high vacuum, wherein no mechanical components such as lubricated bearings or actuators are directly exposed to the environment. In order to achieve such ends, the joints of the apparatus, for example, are further provided with vacuum seals, such as Ferro-fluidic seals. It should be understood that any type of movable vacuum seal that provides an integrity of cleanliness of the process is contemplated as falling within the scope of the present invention. Therefore, the present invention is further operable to provide a motion generation and wafer scanning in a clean, vacuum environment.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A scanning apparatus for scanning a workpiece with respect to an ion beam, the scanning apparatus comprising:
    a base portion;
    a shaft rotatably coupled to the base portion;
    a momentum balance mechanism comprising one or more fixed spring elements;
    a wafer arm coupled to the shaft, wherein the wafer arm further comprises an end effector operably coupled thereto, whereon the workpiece generally resides;
    a moving arm coupled to the shaft, wherein the moving arm is generally fixed relative to the wafer arm, and wherein the moving arm further comprises a moving spring element operably coupled thereto, wherein a force between the moving spring element and the one or more fixed spring elements is operable to generally repel the moving spring element away from the one or more fixed spring elements, wherein the end effector is operable to translate along a first scan path.

2. The scanning apparatus of claim 1, wherein the momentum balance mechanism is rotatably coupled to the shaft, and wherein one or more of the moving arm and the wafer arm is fixedly coupled to the shaft.

3. The scanning apparatus of claim 1, wherein the momentum balance mechanism comprises a pair of elongate momentum balance arms rotatably coupled to the shaft, and wherein the one or more fixed spring elements are coupled to the pair of momentum balance arms.

4. The scanning apparatus of claim 3, wherein the pair of momentum balance arms are individually rotatably coupled to the shaft, and wherein an angular orientation between the pair of momentum balance arms is variable.

5. The scanning apparatus of claim 3, further comprising an amplitude control mechanism operably coupled to the pair of momentum balance arms, wherein the amplitude control mechanism generally determines the angular orientation between the pair of momentum balance arms, therein defining a variable distance between the one or more fixed spring elements associated with the respective momentum balance arms, and therefore defining a variable amplitude of oscillation of the moving spring element.

6. The scanning apparatus of claim 1, wherein one or more of the moving spring element and the fixed spring elements comprise one or more permanent magnets or electromagnets.

7. The scanning apparatus of claim 1, further comprising a rotary seal associated with the shaft, wherein the wafer arm generally resides within a process chamber and the moving arm and momentum balance mechanism generally reside outside the process chamber, and wherein the rotary seal generally isolates an environment outside the process chamber from an environment within the process chamber.

8. The scanning apparatus of claim 1, further comprising:
    a first actuator operably coupled to the shaft, wherein the first actuator is operable to provide a rotational force to the shaft about a first axis.

9. The scanning apparatus of claim 8, wherein the first actuator comprises a servo motor fixedly coupled to the base portion.

10. The scanning apparatus of claim 8, further comprising:
    one or more sensing elements, wherein the one or more sensing elements are operable to sense a position of one or more of the end effector, shaft, momentum balance mechanism, moving spring element, and fixed spring elements; and
    a controller operable to control a rotational velocity of the shaft by controlling an amount of power provided to the first actuator, wherein the control is based, at least in part, on the position sensed by the one or more sensing elements, and wherein a velocity of the end effector is generally constant within a predetermined scanning range along the first scan path.

11. The scanning apparatus of claim 10, wherein the momentum balance mechanism is freely rotatable about the shaft, and wherein the controller is operable to control a rotation of the momentum balance mechanism by controlling the repelling force via the control of the rotational velocity of the shaft.

12. The scanning apparatus of claim 1, wherein the end effector is operably coupled to the wafer arm by a first joint, wherein the end effector is further operable to move in one or more directions with respect to the wafer arm.

13. The scanning apparatus of claim 1, further comprising a secondary translation mechanism comprising a second actuator operably coupled to the base portion, wherein the secondary translation mechanism is operable to move the base along a second scan path, wherein the second scan path is generally perpendicular to at least a portion of the first scan path.

14. A method for scanning a workpiece with respect to an ion beam, the method comprising:
    providing a scanning apparatus comprising a first actuator, a shaft operably coupled to the first actuator, a momentum balance mechanism generally rotatably coupled to the shaft, a wafer arm generally fixedly coupled to the shaft, and a moving arm generally fixedly coupled to the shaft;
    providing a workpiece on the an end effector associated with the wafer arm;
    applying a rotational force to the shaft by providing an amount of power to the first actuator; and oscillating the end effector associated with the wafer arm along a first scan path by controlling an amount of power applied to the first actuator and an orientation of the momentum balance mechanism.

15. The method of claim 14, wherein the momentum balance mechanism further comprises one or more magnets associated with a pair of momentum balance arms operable to rotate independent of the wafer arm and moving arm, wherein the moving arm further comprises one or more magnets associated therewith, wherein the magnets associated with the moving arm are generally repelled by the magnets associated with the momentum balance arms and wherein the control of the first actuator further comprises controlling the rotating of the momentum balance arms.

16. The method of claim 14, further comprising linearly translating the base portion in a direction generally perpendicular to at least a portion of the first scan path, therein defining a second scan path.

17. A two-dimensional scanning apparatus for scanning a workpiece with respect to an ion beam, comprising:
   a wafer arm, whereon a workpiece generally resides;
   a first actuator coupled to the wafer arm and operable to translate the wafer arm in one or more directions along a first scan path; and
   a momentum balance mechanism having one or more magnets associated therewith, wherein the momentum balance mechanism is operable to reverse the translational direction of the workpiece.

18. The two-dimensional scanning apparatus of claim 17, wherein the first actuator comprises a servo motor, and wherein the first scan path is generally curvilinear.

19. The two-dimensional scanning apparatus of claim 17, wherein the wafer arm is coupled to a moving arm, and wherein the moving arm has another one or more magnets associated therewith, and wherein the one or more magnets associated with the momentum balance mechanism are operable to act upon the another one or more magnets associated with the moving arm to reverse the translational direction of the workpiece.

20. The two-dimensional scanning apparatus of claim 17, wherein the one or more magnets comprise one or more of permanent magnets and electro-magnets.

21. A mechanical scanning apparatus for translating a workpiece with respect to an ion beam, the mechanical scanning apparatus comprising:
   a rotatably mounted shaft member;
   an arm member mounted to said shaft member, wherein a rotation of said arm member causes a movement of the workpiece along a scan path;
   an actuator coupled to said shaft member and operable to rotate the shaft member in one or more directions so as to translate the workpiece in one or more directions along the scan path; and
   an oscillatory mechanism comprising one or more magnets adapted to reverse a translational direction of the workpiece.

22. A method for scanning a workpiece with respect to an ion beam, the method comprising:
   mounting an arm in a pendulum-like manner;
   movably supporting the workpiece on said arm; and
   oscillating the arm by magnetic repulsion, so as to provide translational movement of the workpiece along a reversible scan path.

* * * * *